United States Patent [19]

Ovshinsky et al.

[11] Patent Number: 6,087,580

[45] Date of Patent: *Jul. 11, 2000

[54] SEMICONDUCTOR HAVING LARGE VOLUME FRACTION OF INTERMEDIATE RANGE ORDER MATERIAL

[75] Inventors: Stanford R. Ovshinsky, Bloomfield Hills; Subhendu Guha, Troy; Chi-Chung Yang, Troy; Xunming Deng, Troy; Scott Jones, Clinton Township, all of Mich.

[73] Assignee: Energy Conversion Devices, Inc., Troy, Mich.

[ * ] Notice: This patent issued on a continued prosecution application filed under 37 CFR 1.53(d), and is subject to the twenty year patent term provisions of 35 U.S.C. 154(a)(2).

[21] Appl. No.: 08/766,219

[22] Filed: Dec. 12, 1996

[51] Int. Cl.[7] .................................................. H01L 31/00
[52] U.S. Cl. ...................... 136/261; 136/258; 423/348; 423/324; 423/341; 423/325; 423/345; 423/347; 427/578
[58] Field of Search .................................... 136/258, 261; 427/578; 423/348, 324, 341, 325, 345, 347

[56] References Cited

U.S. PATENT DOCUMENTS

| | | |
|---|---|---|
| 4,522,663 | 6/1985 | Ovshinsky et al. ................. 427/578 X |
| 4,598,304 | 7/1986 | Tanaka et al. ....................... 136/261 X |
| 4,666,816 | 5/1987 | Kojima et al. ....................... 427/578 X |
| 5,011,759 | 4/1991 | Hitotsuyanagi et al. ........... 136/261 X |
| 5,017,308 | 5/1991 | Iijima et al. ......................... 427/578 X |
| 5,282,993 | 2/1994 | Karg .................................... 427/578 X |
| 5,358,755 | 10/1994 | Li et al. ............................... 427/578 X |
| 5,417,770 | 5/1995 | Saitoh et al. ........................ 427/578 X |
| 5,646,050 | 7/1997 | Li et al. ............................... 427/578 X |
| 5,677,236 | 10/1997 | Saitoh et al. ........................ 427/576 X |

OTHER PUBLICATIONS

Yang et al., "Stability . . . Dilution", Mat. Res. Soc. Symp. Proc. vol. 336, 1994 pp. 687–692.

Xu et al., "Hydrogen . . . performance", International Conf. on Amorphous Semiconductors, Sep. 1995, pp. 61–64.

*Primary Examiner*—Nam Nguyen
*Assistant Examiner*—Steven H. Ver Steeg
*Attorney, Agent, or Firm*—David W. Schmaker; Marvin S. Siskind; Philip H. Schlazer

[57] ABSTRACT

A high quality non-single-crystal silicon alloy material including regions of intermediate range order (IRO) silicon alloy material up to but not including the volume percentage required to form a percolation path within the material. The remainder of the material being either amorphous or a mixture of amorphous and microcrystalline materials. The materials were prepared by CVD using differing amounts of hydrogen dilution to produce materials containing differing amounts of IRO material. Preferably the material includes at least 8 volume percent of IRO material.

18 Claims, 7 Drawing Sheets

SEMICONDUCTOR HAVING LARGE VOLUME FRACTION OF INTERMEDIATE RANGE ORDER MATERIAL

FIELD OF THE INVENTION

This invention relates to semiconductors in general. In particular, the invention relates to a semiconductor material having a volume fraction of intermediate range ordered materials (crystallite sizes 10–50 Angstroms) of up to, but not including, the volume percentage required to form a percolation path within the material.

BACKGROUND OF THE INVENTION

Within a relatively brief time, semiconductor materials have made possible the creation of a wide range of optical and electronic devices which have played a major role in the shaping of our world. The impact of semiconductor devices has been felt from the battlefield to the playground and from the kitchen to the cosmos. In the earliest stages, semiconductor technology was limited by the use of single crystalline materials. These materials were, of necessity, highly pure and possessed a morphology with extremely regular and long-range periodicity. The dual and interdependent constraints of periodicity and stoichiometry restricted the compositional range, and hence physical properties of crystalline semiconductor materials. As a result single crystalline devices were expensive, difficult to fabricate and limited in their properties.

While conventional wisdom at the time dictated that semiconductor behavior could only be manifested in highly ordered materials, it was recognized by S. R. Ovshinsky that the requirements of periodicity could be overcome and that semiconductor behavior is manifested by various disordered materials. In this regard, see "Reversible Electrical Switching Phenomena and Disordered Structures" by Stanford R. Ovshinsky; Physical Review Letters, vol. 21, No. 20, Nov. 11, 1968, 1450 (C) and "Simple Band Model for Amorphous Semiconducting Alloys" by Morrel H. Cohen, H. Fritzsche and S. R. Ovshinsky; Physical Review Letters, vol. 22, No. 20, May 19, 1969, 1065 (C). Disordered materials are characterized by a lack of long-range periodicity. In disordered semiconductors the constraints of periodicity and stoichiometry are removed and as a result, it is now possible to place atoms in three dimensional configurations previously prohibited by the lattice constants of crystalline materials. Thus, a whole new spectrum of semiconductor materials having novel physical, chemical and electrical properties has been made available. By choice of appropriate material compositions, the properties of disordered semiconductors may be custom tailored over a wide range of values. Disordered semiconductors may be deposited by thin film techniques over relatively large areas and at low cost, and as a result many types of new semiconductor devices have become commercially feasible. A first group of disordered semiconductors are generally equivalent to their crystalline counterparts while a second group manifest physical properties that cannot be achieved with crystalline materials.

As a result of the foregoing, disordered semiconductor materials have come to be widely accepted and a great number of devices manufactured therefrom are in significant commercial use. For example, large area photovoltaic devices are routinely manufactured from amorphous silicon and germanium-based alloys. Such materials and devices are disclosed, for example, in U.S. Pat. Nos. 4,226,898 and 4,217,374 of Ovshinsky et al. Disordered alloy materials have also been used to fabricate photodetector arrays for use in document scanners, drivers for LCD displays, cameras and the like. In this regard see U.S. Pat. No. 4,788,594 of Ovshinsky et al. Disordered semiconductor materials have also been used in devices for the high volume storage of optical and electronic data.

Amorphous materials are presently utilized in a manner to take advantage of the great variety of interactions between constituent atoms or molecules in contrast to the restricted number and kinds of interactions imposed by a crystalline lattice. In the present invention, the advantages of crystalline and amorphous properties can be combined for those devices and applications in which periodicity is essential to the physics. Periodicity can be placed in an amorphous matrix through the utilization of the present invention. The material can include spatially repeating compositional units, atoms, groups of atoms or layers without the overall bulk inhibition of crystalline periodicity.

Also, individual atoms or groups of atoms in various configurations can be provided, which can be combined with other atoms or groups of atoms and be disbursed throughout the material. As stated, the individual atoms or groups of atoms, in these materials need not be in a regular pattern, but can have a varying spatial pattern, such as being graded or nonsequential throughout the material. By the proper choice of atoms or groups of atoms, their orbitals and isolated configurations, anisotropic effects not permitted in any prior type of material can be produced.

These procedures provide varying geometrical environments for the same atom or a variety of atoms, so that these atoms can bond with other surrounding atoms in different coordination configurations as well as unusual nonbonding relationships resulting in entirely new chemical environments. The procedures provide means for arranging different chemical environments which can be distributed and located throughout the material in the spatial pattern desired. For example, one part or portion of a material can have entirely different local environments from other portions. The varying electronic states resulting from the various spatial patterns which are formed and the various chemical environments which can be designed, can be reflected in many parameters as a type of density of states or change of states in the energy gap of a semiconductor except that this density of states can be spatially arranged.

In essence, the material of the invention is a compositionally modulated material utilizing the very concept of irregularity, inhomogeniety, "disorder" or localized order which have been avoided in the prior art, to achieve benefits which have not been exhibited in prior materials. The local environments need not be repeated throughout the material in a periodic manner as in the compositionally modulated materials of the prior art. Further, because of the above-described effects the specific types of disorder and their arrangement in a spatial pattern, the materials as described by this invention cannot be thought of as truly amorphous materials as typically produced by the prior art since the material is more than a random placement of atoms. The placement of atoms and orbitals of a specific type that can either interact with their local environment or with one another depending upon their spacing throughout an amorphous material and an amorphous matrix can be achieved. The composite material appears to be homogeneous, but the positions of the orbitals of the atoms can have relationships designed to emphasize a particular parameter, such as spin compensation or decompensation. The materials thus formed give a new meaning to disorder based on not only nearest neighbor relationships, but "disorder" among functional groups, which can be layers or groups, on a distance scale which can be as small as a single atomic diameter. Hence, a totally new class of "synthetic nonequilibrium multi-disordered" materials have been made available.

It has been found that properties of semiconductor materials in the disordered state will depend upon their morphology and local chemical order and can be affected by various methods of preparation. For example, non-equilibrium manufacturing techniques can provide a local order and/or morphology different from that achieved with equilibrium techniques; and as a result, can change the physical properties of the material. In most instances, an amorphous semiconductor will have a lower electrical conductivity than the corresponding crystalline material and in many instances, the band gap energy, optical absorption coefficient and electronic activation energy of corresponding amorphous and crystalline materials will differ. For example, it has been found that amorphous silicon materials typically have a band gap of approximately 1.6–1.8 eV while crystalline silicon has a band gap of 1.1 eV. It is also important to note that amorphous silicon materials have a direct band gap while the corresponding crystalline material has an indirect band gap and as a result, the optical absorption of amorphous silicon is significantly higher than that of crystalline silicon at or near the band edge. It should also be noted that the dark electrical conductivity of undoped amorphous silicon is several orders of magnitude lower than that of crystalline silicon. It can thus be seen that the various physical properties of silicon strongly depend upon its morphology and local order. Similar relationships are found in a large number of other semiconductor materials.

The principle of the present invention resides in the ability to control the local order of a semi-conductor material from that corresponding to a completely amorphous phase through various other local organizations including intermediate order to a state where the local order is so repetitively periodic that the material is in the single crystalline state. The most important and interesting area of the present invention is the ability conferred thereby to control the local order of a semi-conductor material to produce a material which has valuable properties different from either the amorphous or the crystalline states.

The various properties of amorphous and crystalline silicon confer different advantages in various devices. The high mobility of carriers in crystalline silicon is important in high speed semiconductor circuits while the high level of optical absorption of amorphous silicon is ideal for photovoltaic devices since complete light absorption may be accomplished by relatively thin layers of material, making for a lightweight, low cost device. In some instances, one property of a given morphology and local order of semiconductor may be ideal for a particular purpose whereas the value of another property of that same material may not be so well suited. For example, the aforenoted high optical absorption of amorphous silicon is ideal for a photovoltaic device; however, the fairly wide band gap of amorphous silicon does not permit it to address the longer wavelength portions of the solar spectrum. The use of narrower band gap crystalline material in photovoltaic devices increases the portion of the useable light spectrum and the high conductivity, high mobility and long minority carrier diffusion length in crystalline silicon decreases the series resistance of the photovoltaic device, thereby increasing its overall efficiency; but, the trade-off is that crystalline cells are relatively thick because of their low absorption and hence they are fragile, bulky and expensive.

Previously Ovshinsky, et al. produced materials which included clusters of atoms, typically between 12 and 50 angstroms in diameter. See U.S. Pat. No. 5,103,284, issued Apr. 7, 1992 and entitled "SEMICONDUCTOR WITH ORDERED CLUSTERS." The clusters or grains had a degree of order which is different from both the crystalline and amorphous forms of the material. The small size and ordering of the clusters allowed them to adjust their band structure to thereby relax K vector selection rules. Ovshinsky et al had found that various physical properties of semiconductor materials are decoupled from morphology and local order when those materials are comprised of ordered clusters. This selection rule relaxation occurred because the materials included a volume fraction of the intermediate order materials which was high enough to form percolation pathways within the material.

The onset of the critical threshold value for the substantial change in the physical properties of materials in the ordered cluster state depends upon the size, shape and orientation of the particular clusters. However, it is relatively constant for different types of materials. There exist 1-D, 2-D and 3-D models which predict the volume fraction of clusters necessary to reach the threshold value, and these models are dependent on the shape of the ordered clusters. For example, in a 1-D model (which may be analogized to the flow of charge carrier through a thin wire) the volume fractions of clusters in the matrix must be 100% to reach the threshold value. In the 2-D model (which may be viewed as substantially conically shaped clusters extending through the thickness of the matrix) the volume fraction must be about 45% to reach the threshold value, and finally the 3-D model (which may be viewed as substantially spherical clusters in a sea of matrix material) the volume fraction need only be about 16–19% to reach the threshold value.

Therefore, the materials disclosed and claimed in U.S. Pat. No. 5,103,284 have at least 16–19 volume percent of intermediate range order material for spherical clusters, at least 45 volume percent for conically shaped clusters and 100 volume percent for filamentary clusters.

The instant inventors have now found that materials including any volume percent of the intermediate range order material (i.e. the ordered clusters) will have properties which (while not necessarily decoupled) differ from materials with no intermediate range order material. These materials are particularly useful in the form of thin films used in devices such as: photovoltaic devices, thin-film diodes, thin-film transistors, photoreceptors, etc.

SUMMARY OF THE INVENTION

The instant inventors have produced high quality non-single-crystal silicon alloy material including a volume percent of regions of intermediate range order (IRO) silicon alloy material up to, but not including the volume percentage required to form a percolation path within the material. The remainder of the material being either amorphous or a mixture of amorphous and microcrystalline materials. The materials were prepared by PECVD using differing amounts of hydrogen dilution to produce materials containing differing amounts of IRO material.

The silicon alloy material additionally includes hydrogen and/or a halogen, such as fluorine. The material is preferably in the form of a thin film, which is useful in devices such as photovoltaic devices, diodes, transistors, and photoreceptors.

DETAILED DESCRIPTION OF THE INVENTION

Figure 1:
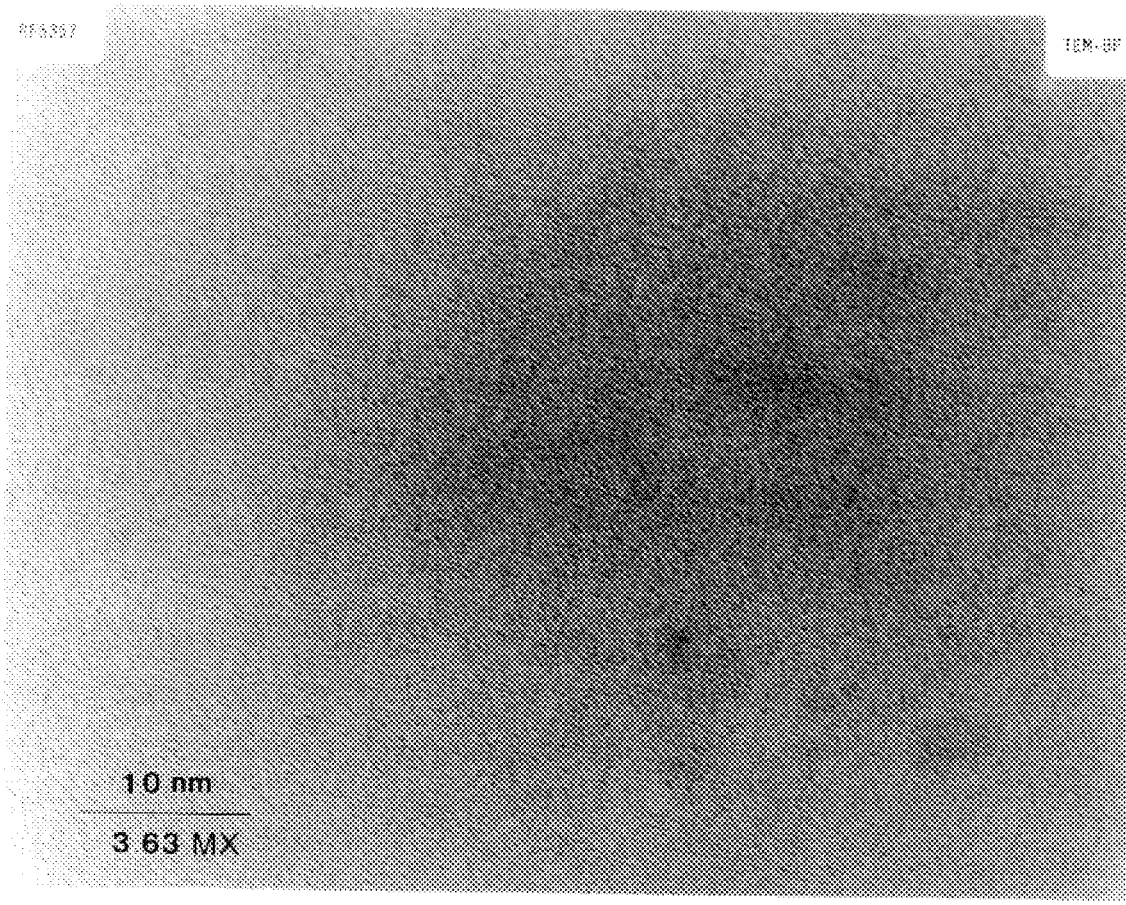
FIG. 1 is a bright-field transmission electron micrograph (TEM) of a reference silicon material produced using no hydrogen dilution.

The existence of intermediate range order (IRO) material has been known since at least 1981. See for example a paper co-authored by one of the instant inventors, S. R. Ovshinsky, entitled "THE NATURE OF INTERMEDIATE RANGE ORDER IN SI:F:H:(P) ALLOY SYSTEMS", Tsu et al., Journal De Physique Colloque C4, No. 10, 42, pp. C4-269–72, October 1981. The instant inventors have been investigating the deposition of silicon materials by plasma enhanced chemical vapor deposition (PECVD) from disilane ($Si_2H_6$) and hydrogen ($H_2$). More recently they have investigated deposition using high hydrogen dilution. See for example "STABILITY STUDIES OF HYDROGENATED AMORPHOUS SILICON ALLOY SOLAR CELLS PREPARED WITH HYDROGEN DILUTION", Yang et al., Materials Research Society Symposium Proceedings, Vol. 336, pp. 687–92, 1994; and "HYDROGEN DILUTION EFFECTS ON a-Si:H AND a-SiGe:H MATERIALS PROPERTIES AND SOLAR CELL PERFORMANCE", Xu et al., International Conference on Amorphous Semiconductors (ICAS 16), September 1995.

The Instant inventors have now found that very high hydrogen dilution during CVD deposition of silicon results in materials having volume fractions of intermediate range order (IRO) material. The instant inventors have also found that these materials, while not having the decoupled properties of the materials of the 5,103,284 patent, have properties which are enhanced over those materials which have no IRO material.

As used herein, an intermediate range order (IRO) material shall be defined as a material having atomic aggregations of very short range periodicity, and comprised of a plurality of highly ordered, relatively small atomic aggregations, typically extending no more than 50 atomic diameters. The exact dimensions of the aggregations in these materials will depend upon the particular semiconductor material in question, but typically they are in the range of 10 to 80 angstroms and preferably about 30–50 angstroms. The IRO materials have a periodicity and local order differing from an amorphous or fully crystalline material.

In the IRO materials, local order is propagated but does not reach the point of becoming long range order; and therefore, lattice constants of the crystalline state do not become the determination factor of the material's properties. In the IRO materials, the bond lengths and angles are much more flexible than in materials with long range periodicity.

Samples were prepared by PECVD using differing amounts of hydrogen dilution to produce materials containing differing amounts of IRO material. The deposition parameters of the samples are given in Table 1.

TABLE 1

| Sample # | LL 1208 | LL 1235 | LL 1222 | LL 1234 | LL 1221 | LL 1223 | 8013 | 8035 | 8014 | RF 5357 |
| --- | --- | --- | --- | --- | --- | --- | --- | --- | --- | --- |
| $Si_2H_6$ Flow (SCCM)* | 0.4 | 0.35 | 0.3 | 0.25 | 0.2 | 0.1 | 0.3 | 0.55 | 0.8 | 2 |
| $H_2$ Flow (SCCM) | 99 | 99 | 99 | 99 | 99 | 99 | 49.2 | 49.2 | 49.2 | 0 |
| RF Power (watt) | 5 | 5 | 5 | 5 | 5 | 5 | 1.8 | 1.4 | 1.5 | 2 |
| Deposition Rate (Å/sec) | | | | | | | 0.25 | 0.55 | 0.8 | 1.4 |
| Dep. Temperature ° C. | 150 | 150 | 150 | 150 | 150 | 150 | 300 | 300 | 300 | 300 |
| Dep. Pressure (Torr) | 1.5 | 1.5 | 1.5 | 1.5 | 1.5 | 1.5 | 1.35 | 1.35 | 1.35 | .6 |
| Volume % IRO | 9–11 | 10–12 | 2–4 | 12–14 | 15–17 | 18–20 | 8–10 | 5–6 | 3–4 | 0 |
| Volume % microcryst. | 0 | 0 | 1–3 | 20–22 | 50–52 | 37–39 | 6–7 | 0 | 0 | 0 |
| Fill Factor (initial) | 0.72 | | | | | | 0.68 | | 0.65 | 0.55 |
| Fill Factor (degraded) | 0.67 | | | | | | 0.61 | | 0.55 | 0.46 |
| Degradation (%) | 6.9 | | | | | | 11.3 | | 15.4 | 16.4 |
| i-layer Thickness (Å) | 2000 | | | | | | 4200 | | 4200 | 4200 |

*Except sample RF 5357 which indicates the flow rate of mono-silane ($SiH_4$).

While there are a variety of methods by which the materials of the present invention may be prepared (i.e. thin film deposition techniques such as laser ablation, sputtering, chemical vapor deposition, plasma deposition processes, and evaporation processes) the most preferred is plasma enhanced chemical vapor deposition (PECVD). The instant RF PECVD method is normal in most respects except that the temperature is controlled and the hydrogen dilution level is very high. For example the hydrogen to disilane ratio is typically greater than about 98:1 and is preferably greater than about 99:1.

The critical element of any deposition process is the control of crystallite size so as to keep the material in the intermediate range order deposition regime. In general, processes of fairly slow growth on a very large number of nuclei will produce a material having a larger volume fraction of IRO material therein. For example, in the instant plasma deposition process, a forward reaction takes place in which the precursor gas species disilane is decomposed to yield a solid silicon deposit. This process also includes a reverse reaction wherein the high concentration of hydrogen reacts with the newly deposited silicon to etch away that silicon and regenerate the gaseous species. Deposition rate is a function of the balance of the forward and reverse reactions. Addition of high concentrations of etchant material (i.e. hydrogen), speeds up the etching process and thereby slows the rate of deposition and enhances IRO material growth. In addition to, or instead of the foregoing, other etchant species such as fluorine may be added to the process to similarly moderate deposition rates.

While increasing the hydrogen dilution of the reacting gaseous mixture increases the volume fraction of the intermediate range order in the deposited material, the instant inventors have found that there is a limit to this effect. That is, beyond a certain hydrogen dilution level, an increase in the hydrogen dilution level causes microcrystalline materials to be deposited in ever increasing volume fraction. This in turn can lead to a reduction in the volume fraction of the IRO material. The instant inventors have also seen that this dilution limit is temperature sensitive. That is, the dilution limit at a substrate temperature of 300° C. seems to be much lower than the limit at about 150° C. Therefore by adjustment of the hydrogen dilution, the substrate temperature and other deposition parameters which effect the deposition rate, the volume fraction of IRO material in the deposited material can be controlled.

While fluorine functions as an etchant material to moderate crystal growth and hence allow for the preparation of the IRO material of the present invention, the effects of fluorine extend beyond its role as a simple etchant. Fluorine is a superhalogen and as such exerts effects not attainable by the use of and amount of hydrogen or other halogens in the deposition atmosphere. Fluorine acts to provide a different, and improved, local order in the material and to control the size and morphology of the intermediate range order material. Fluorine also reacts with deviant morphological and electrical states as they are formed in the material thereby moderating the bulk electrical properties of the material.

Therefore when used in deposition, fluorine plays several important roles in the deposition of the material of the present invention, in the plasma or vapor state as well as on the surface of the IRO material, in the bulk of the IRO material and at the interfaces between the IRO material and the remainder of the material. It also is beneficial in reducing the density of defect states in the gap of the material. Fluorine is a very active etchant material and it is generally preferable that it be moderated, for example by dilution with hydrogen.

Turning now to characterization of the sample materials, FIG. 1 is a (magnification: 3.63 millionx) bright-field transmission electron micrograph (TEM) of a silicon material (Sample # RF 5357) produced by PECVD at a substrate temperature of 300° C. using no hydrogen dilution. From a perusal of the micrograph it is clear that the material is purely amorphous with no signs of any intermediate or long range order (a fact born out by the Raman data presented herein below).

Figure 2:
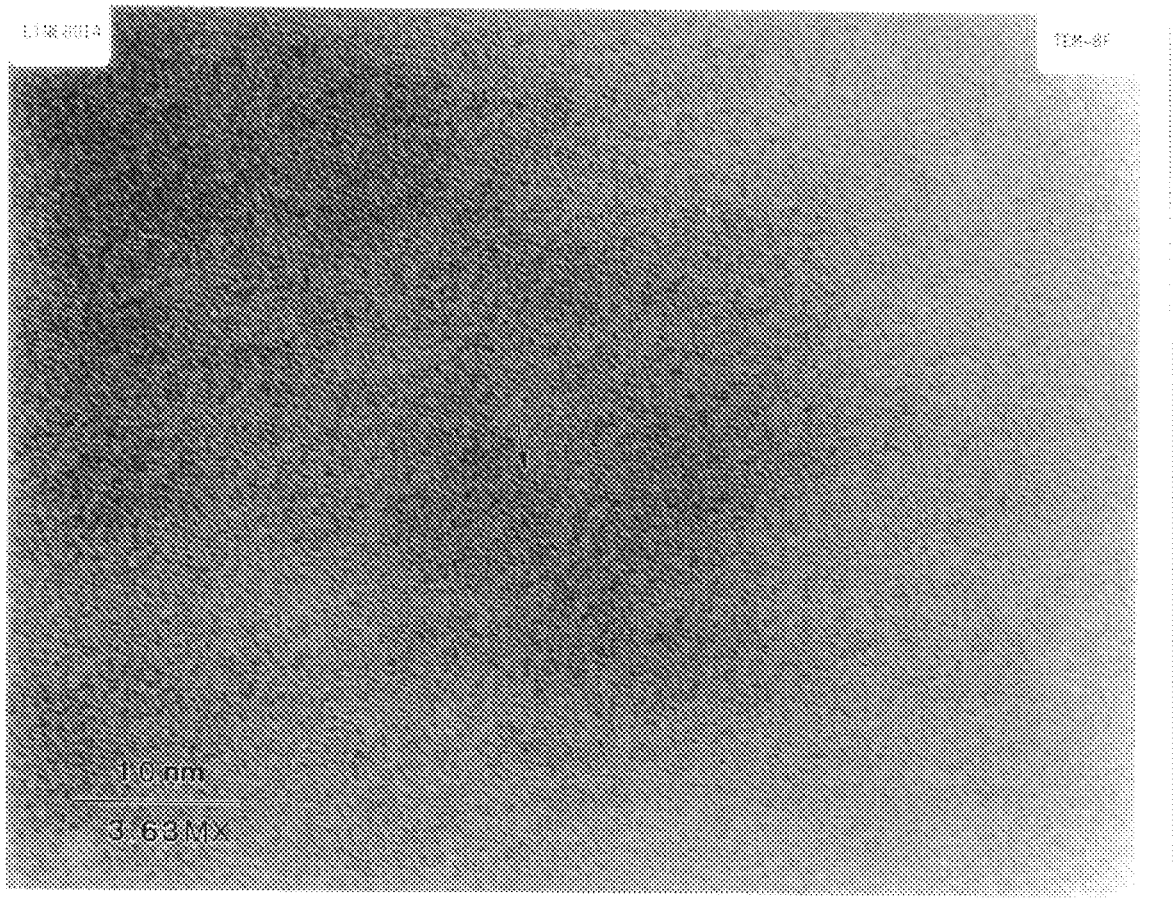
FIG. 2 is a bright-field TEM of a reference hydrogenated silicon alloy material produced using low hydrogen dilution.

FIG. 2 is a (magnification: 3.63 millionx) bright-field TEM of a hydrogenated silicon alloy material (Sample # 8014) produced by PECVD at a substrate temperature of 300° C. using low hydrogen dilution. From a perusal of the micrograph it is clear that the material, while still mostly amorphous, does exhibit some signs of intermediate range order.

Figure 3:
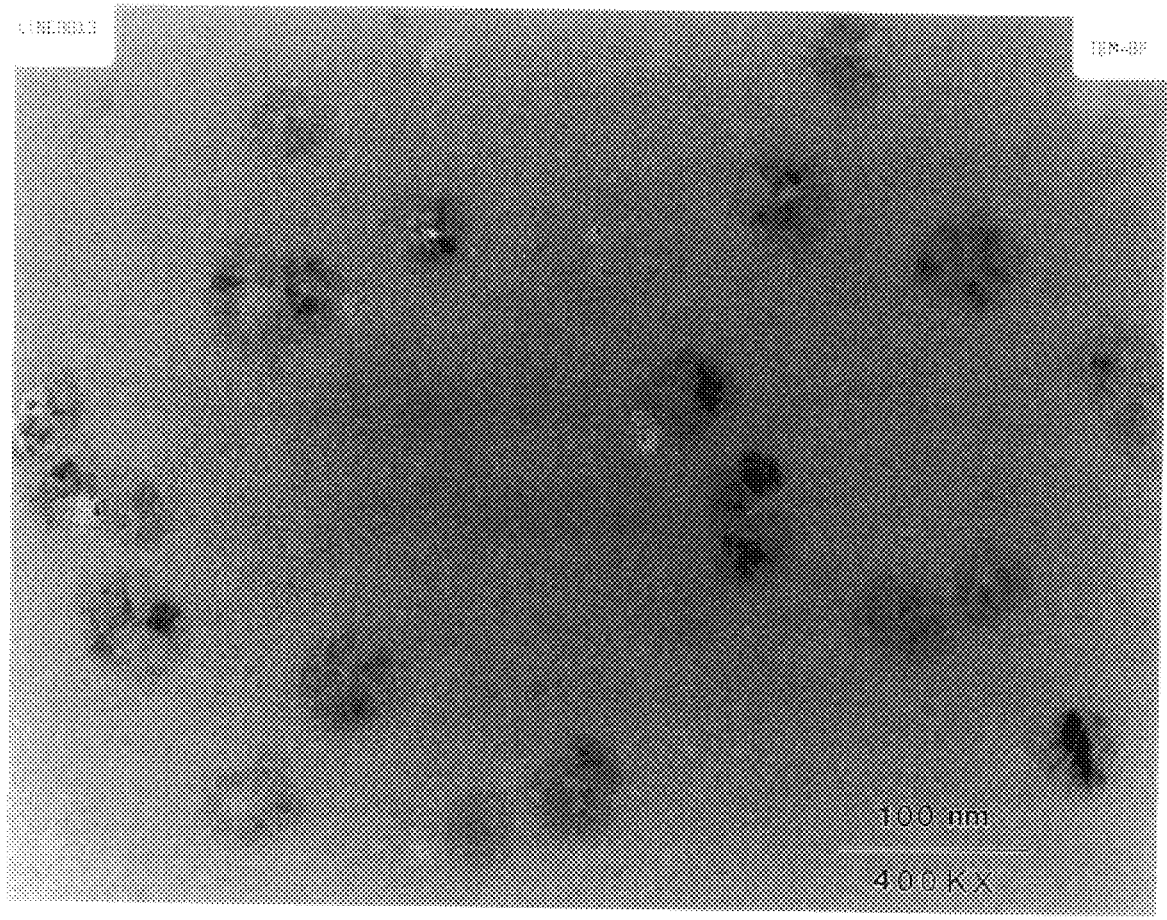
FIGS. 3 and 4 are bright-field and dark-field TEMs, respectively, of a hydrogenated silicon alloy material according to the instant invention produced using high hydrogen dilution.
Figure 4:
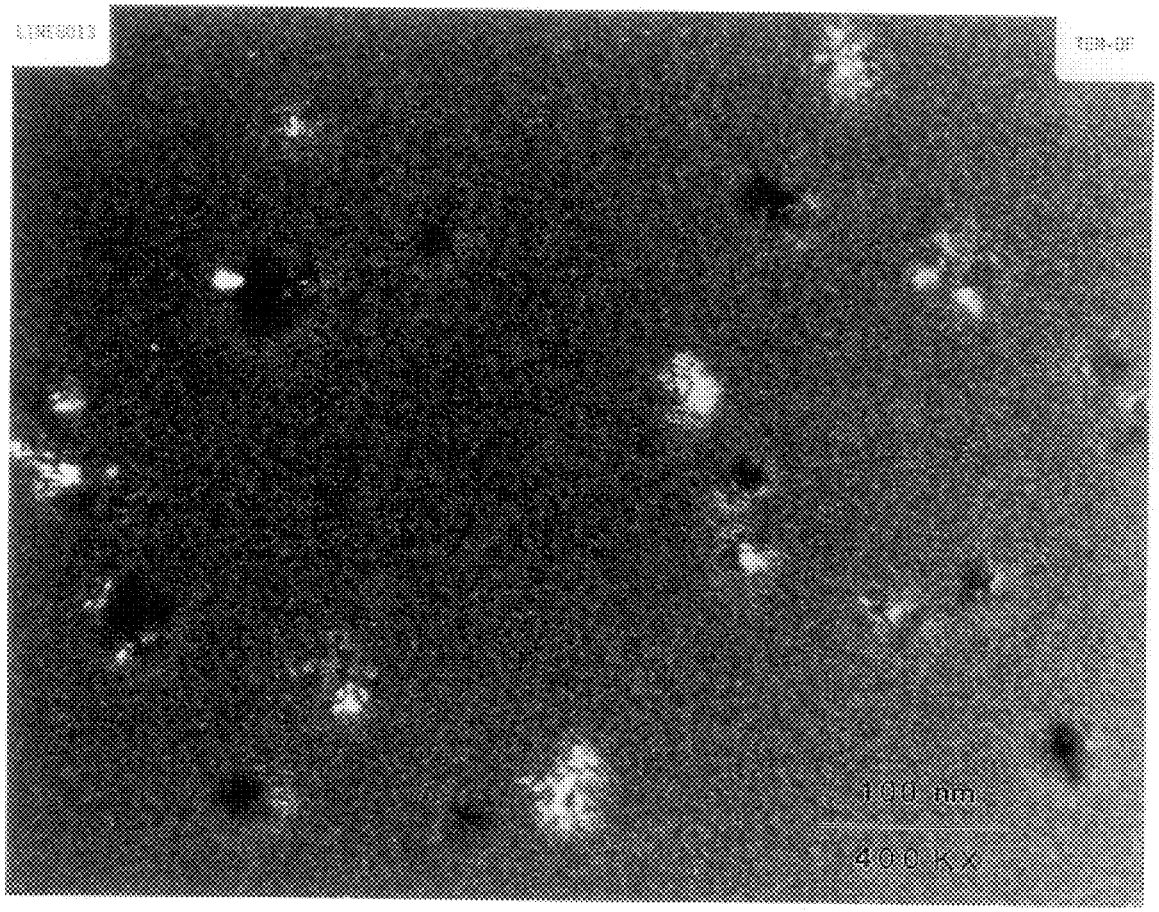

FIGS. 3 and 4 are (magnification: 400 thousandx) bright-field and dark-field TEMs, respectively, of a hydrogenated silicon alloy material (Sample # 8013) produced by PECVD at a substrate temperature of 300° C. using high hydrogen dilution. From a perusal of the micrograph it is clear that the material contains both microcrystalline and non-crystalline "amorphous" material. It should be noted that at this magnification the IRO materials cannot be seen.

Figure 5:
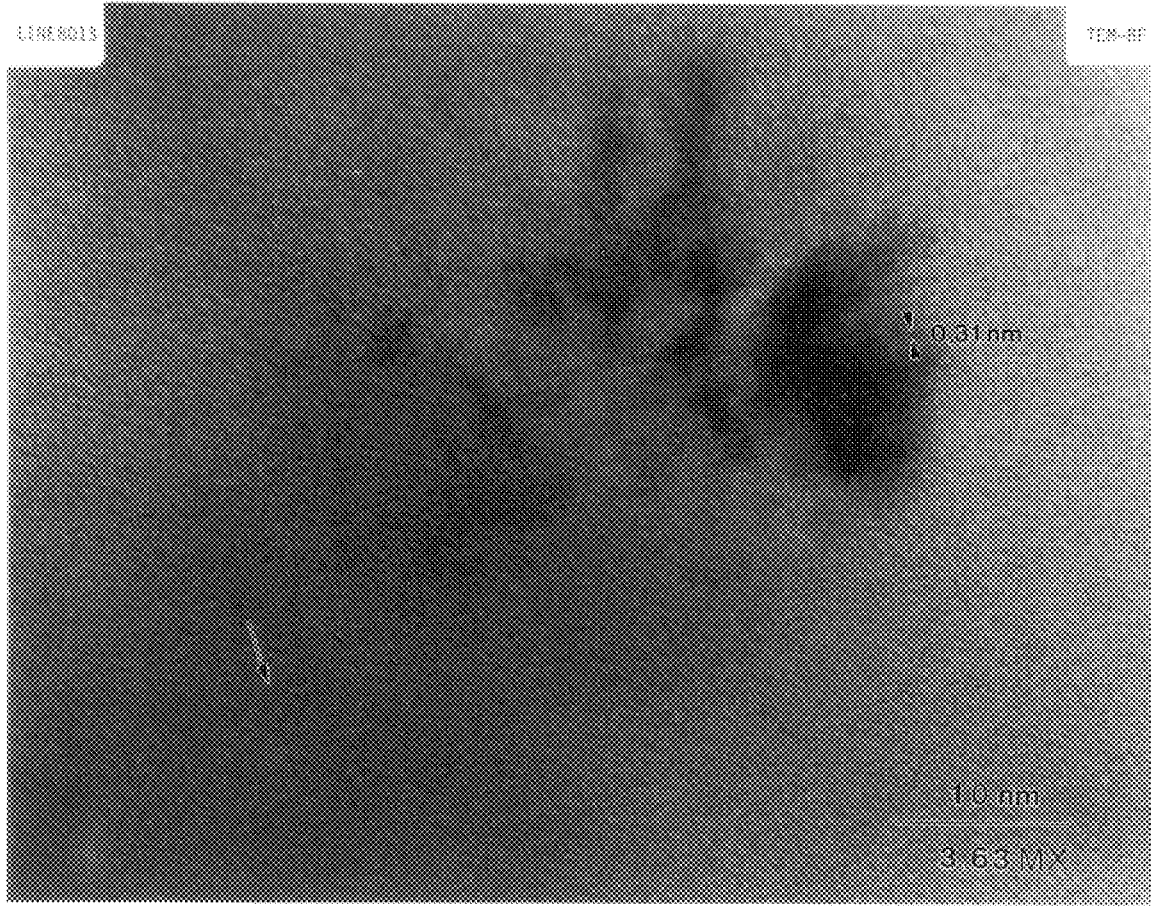
FIG. 5 is a (magnification: 3.63 millionx) bright-field TEM of the hydrogenated silicon alloy material of FIGS. 3 and 4, specifically illustrating that the material of the instant invention contains IRO material.

FIG. 5 is a (magnification: 3.63 millionx) bright-field TEM of the hydrogenated silicon alloy material of FIGS. 3 and 4. From a perusal of this micrograph it is clear that the material contains microcrystalline, amorphous and IRO material. The IRO material can clearly be seen in the lower left corner of the micrograph.

Figure 6:
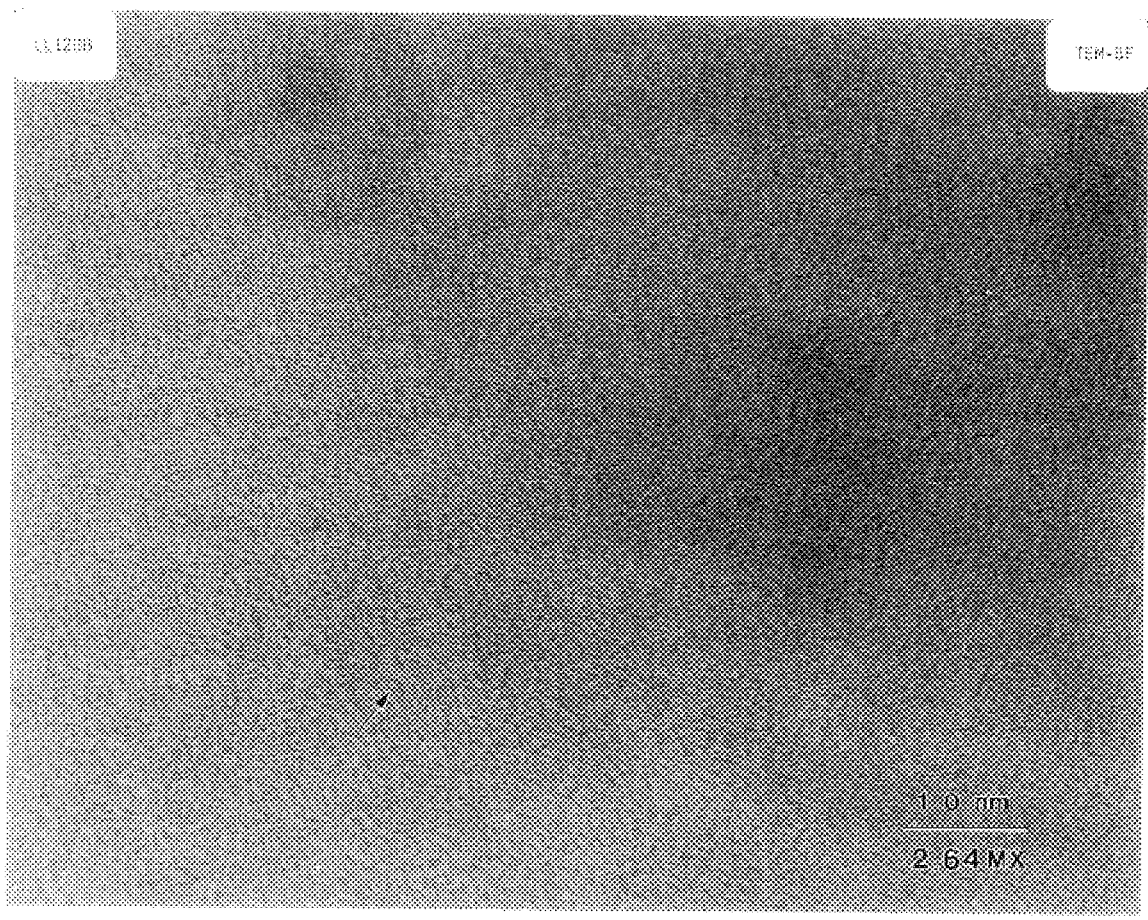
FIG. 6 is a (magnification: 2.64 millionx) bright-field TEM of a hydrogenated silicon alloy material according to the instant invention produced by PECVD using medium hydrogen dilution.

FIG. 6 is a (magnification: 2.64 millionx) bright-field TEM of a hydrogenated silicon alloy material (Sample # LL1208) produced by PECVD at a substrate temperature of 150° C. using medium hydrogen dilution. From a perusal of this micrograph it is clear that the material contains IRO material, which can be seen as serpentine ordered areas in the micrograph.

Figure 7:
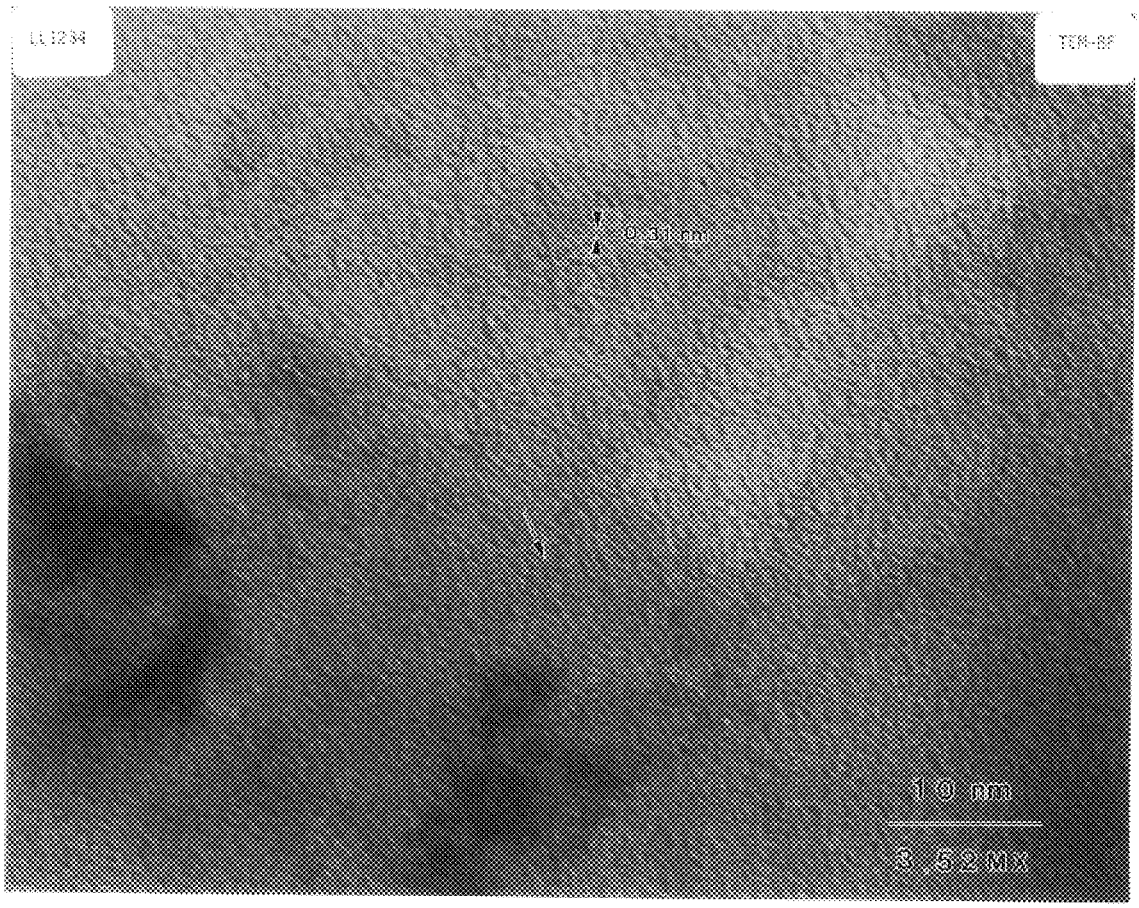
FIG. 7 is a (magnification: 3.52 millionx) bright-field TEM a hydrogenated silicon alloy material according to the instant invention produced by PECVD using high hydrogen dilution.

FIG. 7 is a (magnification: 3.52 millionx) bright-field TEM a hydrogenated silicon alloy material (Sample # LL1234) produced by PECVD at a substrate temperature of 150° C. using high hydrogen dilution. From a perusal of this micrograph it is clear that the material contains microcrystalline, amorphous and IRO material. The serpentine IRO material can clearly be seen in the center of the micrograph.

In addition to the evidence of the TEMs, the instant inventors have used Raman scattering to characterize the deposited samples. The silicon transverse optical (TO) Raman spectrograph peaks for four samples of thin film hydrogenated silicon produced by PECVD at a substrate temperature of 300° C. and varying silane to hydrogen ratios. One of the samples was deposited using no hydrogen dilution of the silane (Sample # RF 5357). The other samples are of silicon deposited using differing values of hydrogen dilution of the silane in the deposition mixture (i.e. Samples 8013, 8035 and 8014 respectively). From the Raman spectrographs, the inventors have discovered that as the hydrogen dilution of the silane increases, the TO peak shifts from the typical "amorphous" 474 cm$^{-1}$ up to about 482.3 cm$^{-1}$ for the highly diluted sample (i.e. 8013). Additionally, the highly diluted sample (8013) shows another peak centered around 517 cm$^{-1}$. This additional peak is attributable to the microcrystalline inclusions which are formed in this high temperature, high dilution sample. (See the discussion of the TEM photomicrographs hereinabove.) The shift of the TO peak from 474 cm$^{-1}$ up to about 482.3 cm$^{-1}$ appears to be from a heretofore unrecognized feature. This feature appears to indicate the presence of IRO material. That is, the Raman data indicates the presence of areas of ordered materials which are smaller than and different from microcrystalline inclusions. It is believed that the IRO inclusions are 10–80 Angstrom crystallites grouped into serpentine chains.

A comparison of both TO peaks for the high hydrogen dilution sample (8013) and the no hydrogen dilution sample (RF 5357) superimposed and aligned by the laser plasma lines onto the same graph shows that the TO peak of the high-hydrogen-dilution sample (8013) includes a microcrystalline peak at about 517 cm$^{-1}$ which is not seen in the no-hydrogen-dilution sample (RF 5357). The comparison also shows an additional peak at about 490 cm$^{-1}$ which is not seen in the no-hydrogen-dilution sample (RF 5357). Similar comparison for the medium and low-hydrogen-dilution samples respectively indicate that the 490 cm$^{-1}$ peak truly exists.

Another sample (LL1208) was made using high hydrogen dilution and low substrate temperature (150° C.). This material has a TO peak of about 482 cm$^{-1}$ and no microcrystalline peak. The Raman clearly indicates an IRO material peak.

The semiconductors of the present invention may be prepared from a large number of materials and they are applicable to a wide variety of semiconductor devices. While the foregoing discussion was primarily concerned with silicon alloy devices for photovoltaic applications, it will be appreciated that the principles herein disclosed may be similarly extended to other types of devices, such as: thin-film diodes, thin-film transistors, photoreceptors, etc. and other materials, such as: alloys of silicon with germanium, carbon, oxygen, etc. and doped silicon. The foregoing drawings, discussion and description are not meant to be limitations upon the practice of the present invention but illustrations thereof. It is the following claims, including all equivalents, which define the scope of the invention.

We claim:

1. A non-single-crystal silicon alloy material comprising:

regions of intermediate range order material having crystallite sizes of ranging from 10 to 50 Angstroms in size and comprising at least 8 volume percent, but not including greater than or equal to the volume percentage required to form a percolation path within the material; and the remainder of the material being either amorphous or a mixture of amorphous and microcrystalline materials, wherein said microcrystalline material, if present, forms no more than about 7 volume percent of said material.

2. The silicon alloy material of claim 1, wherein said silicon alloy material additionally includes hydrogen.

3. The silicon alloy material of claim 2, wherein said silicon alloy material additionally includes a halogen.

4. The silicon alloy material of claim 3, wherein said halogen is fluorine.

5. The silicon alloy material of claim 1, wherein said silicon alloy material additionally includes a halogen.

6. The silicon alloy material of claim 5, wherein said halogen is fluorine.

7. The silicon alloy material of claim 1, wherein said alloy material is in the form of a thin film.

8. The silicon alloy material of claim 7, wherein said thin film is incorporated into a photovoltaic device.

9. The silicon alloy material of claim 7, wherein said thin film is incorporated into a diode.

10. The silicon alloy material of claim 7, wherein said thin film is incorporated into a transistor.

11. The silicon alloy material of claim 7, wherein said thin film is incorporated into a photoreceptor.

12. The silicon alloy material of claim 7, wherein said intermediate range order regions are serpentine clusters.

13. The silicon alloy material of claim 1, wherein said regions of intermediate range order silicon alloy material are 1-D and their volume percentage ranges from 8 to less than 100%.

14. The silicon alloy material of claim 1, wherein said regions of intermediate range order silicon alloy material are 2-D and their volume percentage ranges from 8 to less than 45%.

15. The silicon alloy material of claim 1, wherein said regions of intermediate range order silicon alloy material are 3-D and their volume percentage ranges from 8 to less than 19%.

16. The silicon alloy material of claim 1, wherein said silicon alloy material also includes germanium.

17. The silicon alloy material of claim 1, wherein said silicon alloy material also includes carbon.

18. The silicon alloy material of claim 1, wherein said silicon alloy material also includes oxygen.

* * * * *